US009249319B2

(12) United States Patent
Huh et al.

(10) Patent No.: US 9,249,319 B2
(45) Date of Patent: Feb. 2, 2016

(54) LIQUID ADDITIVE FOR ETCHING SILICON NITRIDE AND SILICON OXIDE LAYERS, METAL INK CONTAINING THE SAME, AND METHOD OF MANUFACTURING SILICON SOLAR CELL ELECTRODES

(75) Inventors: Joo-Youl Huh, Seoul (KR); Hyun-Gang Kim, Seoul (KR); Bo-Mook Chung, Gyeonggi-do (KR); Sung-Bin Cho, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 165 days.

(21) Appl. No.: 13/169,515

(22) Filed: Jun. 27, 2011

(65) Prior Publication Data

US 2011/0318870 A1      Dec. 29, 2011

(30) Foreign Application Priority Data

Jun. 29, 2010   (KR) .................. 10-2010-0062329
Feb. 23, 2011   (KR) .................. 10-2011-0016196

(51) Int. Cl.
*C09K 13/00*   (2006.01)
*C09D 11/03*   (2014.01)
*H01L 31/0224*   (2006.01)

(52) U.S. Cl.
CPC ........ *C09D 11/03* (2013.01); *H01L 31/022425* (2013.01); *Y02E 10/50* (2013.01)

(58) Field of Classification Search
None
See application file for complete search history.

(56) References Cited

U.S. PATENT DOCUMENTS 2,729,619 A * 1/1956 Sullivan ..................... 528/279
2,945,790 A * 7/1960 Grigger ....................... 205/333
3,028,339 A * 4/1962 Inoue et al. ............ 252/301.6 S
3,239,308 A * 3/1966 Van Wirt ..................... 423/93
3,872,161 A * 3/1975 Fukuchi et al. ............. 560/217
4,371,706 A * 2/1983 Edmonds et al. ........... 562/553
4,589,961 A * 5/1986 Gershenson ................. 205/51
4,649,064 A * 3/1987 Jones .................. B41M 5/5236
                                                           346/96
5,206,208 A * 4/1993 Liang et al. ................. 503/201
6,409,958 B1 * 6/2002 Hosono et al. .............. 264/466
2003/0041526 A1 * 3/2003 Fujii et al. .................... 51/307
2006/0258169 A1 * 11/2006 Rana et al. .................. 438/756
2007/0176960 A1 * 8/2007 Tsuruko ................. B41J 2/2114
                                                           347/21

OTHER PUBLICATIONS

Chemical Book, Zinc acetate, 2008, Chemical Book, p. 1.*
Chemical Book, Lead acetate, 2008, Chemical Book, p. 1.*
Wikipedia, Wikipedia, Jan. 28, 2014, Wikipedia, 6 pages total including Wikipedia page, terephthalic acid, isophthalic acid, phthlalic acid, Adipic acid, sebacic acid pages.*

* cited by examiner

*Primary Examiner* — Binh X Tran
*Assistant Examiner* — David Cathey, Jr.
(74) *Attorney, Agent, or Firm* — Locke Lord LLP; Howard M. Gitten (57) ABSTRACT

The present invention relates to a liquid additive for etching silicon nitride and silicon oxide layers, a metal ink including the same for forming silicon solar cell electrodes and a method for manufacturing silicon solar cell electrodes. More particularly, it relates to a liquid additive including metal nitrate, metal acetate, or hydrates thereof and a metal ink for forming silicon solar cell electrodes, mixed with the liquid additive and a metal. Further, it relates to a method for manufacturing silicon solar cell electrodes comprising a one-step non-contact printing for etching of a silicon nitride layer or silicon oxide layer and forming electrodes.

15 Claims, 3 Drawing Sheets

LIQUID ADDITIVE FOR ETCHING SILICON NITRIDE AND SILICON OXIDE LAYERS, METAL INK CONTAINING THE SAME, AND METHOD OF MANUFACTURING SILICON SOLAR CELL ELECTRODES

CROSS-REFERENCE TO RELATED APPLICATION

This application claims the benefit of priority to Korean Application No. 10-2010-0062329 filed Jun. 29, 2010 and No. 10-2011-0016196 filed Feb. 23, 2011, the contents of which are incorporated herein by reference.

TECHNICAL FIELD

The present invention relates to a liquid additive for etching silicon nitride and silicon oxide layers, a metal ink containing the same for forming silicon solar cell electrodes and a method for manufacturing silicon solar cell electrodes. More preferably, it relates to a liquid additive containing a metal nitrate or a metal acetate, a metal ink containing the liquid additive, and a method for manufacturing fire-through contacts of crystalline silicon solar cells by one-step non-contact printing of the metal ink and firing the printed metal ink.

BACKGROUND

Printing is one of methods for manufacturing electrodes on the front and back sides of a silicon solar cell. It can be divided into a contact printing and a non-contact printing. A screen printing, which is one of contact printings, is a method for manufacturing electrodes by printing circuits with a metal paste on a silicon substrate and then by heat-treating the result. The metal paste includes glass frit for etching an anti-reflection coating (ARC) or passivation coating film and metal powder for forming electrodes with an n-type or p-type silicon substrate.

The metal paste printed and heat-treated on a silicon substrate etches an anti-reflection coating or passivation coating film and reacts with the silicon substrate to form metal crystallites on the surface of the silicon substrate. The metal crystallites form ohmic contact with the p-type or n-type silicon substrate to form electrodes of a silicon solar cell.

However, the contact printing such as screen printing may damage or break the silicon substrate due to the pressure applied to the silicon substrate during a printing process. Such breakage problems become more serious as silicon solar cells get thinner.

On the contrary, the non-contact printing can prevent such breakage problems to a solar cell since no pressure is applied to the silicon substrate during the printing process. The non-contact printing includes ink-jet printing, aerosol jet printing and the like. Since the non-contact printing is a method to spray a printing material through a fine nozzle, liquid metal ink having a low viscosity, unlike the screen printing, is used. One typical metal ink is Ag ink Ag ink may be either Ag nanoparticle ink which is manufactured by dispersing Ag nanoparticles in a solvent or metallo-organic decomposition (MOD) ink which is manufactured by dissolving a Ag compound in an organic solvent for preventing a jam of the spray nozzle during a printing process.

The non-contact printing offers a simple printing method without any waste of printing materials. Thus, the non-contact printing has received attention as a technology to improve the manufacturing process and yield of silicon solar cells with thinner thickness in the solar cell industry.

However, since conventional Ag inks used in the non-contact printing cannot etch silicon nitride ($SiN_x$ or $SiN_x$:H) anti-reflection coating and silicon oxide ($SiO_2$) passivation coating films which are non-conductors, a material that can etch anti-reflection coating or passivation coating film should be printed before printing the Ag ink for forming the electrodes. Therefore, the non-contact printing method using conventional Ag inks requires two-step process including etching the surface coating layer and forming the electrodes, which results in inefficiency of overall manufacturing process and high manufacturing cost.

Accordingly, it has been considered to mix nano-sized glass powder, which can etch an insulating layer such as silicon nitride or silicon oxide, with Ag ink to form the electrodes of silicon solar cells by a one-step non-contact printing. However, cost for manufacturing nano-sized glass powder is high and uniform dispersion of glass powder in a metal ink for a non-contact printing is difficult.

DISCLOSURE

Technical Problem

The inventors of the present invention complete the invention by manufacturing electrodes of a thin silicon solar cell more effectively using a non-contact printing method.

An aspect of the invention is to provide a liquid additive for etching a silicon nitride layer or silicon oxide layer by being mixed in a metal ink.

Another aspect of the invention is to provide a metal ink containing the liquid additive for a non-contact printing to manufacture electrodes of a silicon solar cell.

Further another aspect of the invention is to provide a method for manufacturing electrodes of a silicon solar cell by using the metal ink for a non-contact printing.

Technical Solution

According to an aspect of the invention, there is provided a liquid additive for etching silicon or silicic compound comprising: at least one of a first component chosen from the group consisting of a metal nitrate, a metal acetate, and hydrates thereof; and an organic solvent.

According to an embodiment, the liquid additive may further comprise at least one of a second component chosen from another metal nitrate, another metal acetate, and hydrates thereof, in which the metal is different from that of the first component.

According to an embodiment, the silicic compound may be chosen from the group consisting of silicon nitride ($SiN_x$) and silicon oxide ($SiO_2$).

According to an embodiment, the first component may be chosen from the group consisting of lead nitrate, lead acetate, and hydrates thereof.

According to an embodiment, the first component may be lead nitrate.

According to an embodiment, the second component may be chosen from the group consisting of zinc nitrate, zinc acetate, and hydrates thereof.

According to an embodiment, the second component may be zinc nitrate hexahydrate.

According to an embodiment, the organic solvent may be chosen from the group consisting of alcohol, polyhydric alcohol, ether, and glycol ether.

According to an embodiment, the organic solvent may be polyhydric alcohol.

According to an embodiment, the polyhydric alcohol may be ethylene glycol.

According to another aspect of the invention, there is provided a non-contact printing metal ink for manufacturing silicon solar cell electrodes, the metal ink comprising: the liquid additive above described; and a metal for forming electrodes.

According to an embodiment, a mass ratio between (Pb+Zn) of the liquid additive and the metal for forming electrodes may be from 5:95 to 1:99.

According to an embodiment, the metal may be silver or nickel.

According to an embodiment, the metal may have a diameter of 200 nm to 5 nm.

According to an embodiment, the metal may be a metal compound dissolved in a solvent.

According to an embodiment, the metal compound may be silver nitrate or nickel nitrate.

According to another aspect of the invention, there is provided a method for manufacturing silicon solar cell electrodes comprising; preparing the liquid additive above described; manufacturing a metal ink by mixing the liquid additive with a metal; printing the metal ink on the silicic compound layer of the front or back side of a solar cell by a non-contact printing method; and firing the printed metal ink at 700° C. to 850° C.

According to an embodiment, the method may further comprise drying the printed or coated metal ink at 120° C. to 350° C. to evaporate an organic solvent.

According to an embodiment, the silicic compound may be chosen from silicon nitride ($SiN_x$) and silicon oxide ($SiO_2$).

According to an embodiment, the method may further comprise increasing the aspect ratio of the manufactured electrode lines of silicon solar cells by plating a metal.

According to an embodiment, the plating may be light-induced plating (LIP).

Advantageous Effect

According to the present invention, there is provided a liquid additive which is able to etch silicon nitride or silicon oxide through firing at a temperature of 800° C. or less. A non-contact printable metal ink for manufacturing silicon solar cell electrodes may be manufactured by mixing the liquid additive with a metal nanoparticle ink. The metal ink may then printed on the surface of a silicon solar cell by a non-contact printing method and fired to form silicon solar cell electrodes through etching the silicon nitride or silicon oxide layer present on the surface of the silicon solar cell.

According to the present invention, both the etching of a silicon nitride or silicon oxide layer and the formation of an electrode can be carried out at the same time by employing a one-step non-contact printing and then firing. The present invention is particularly beneficial for the fabrication of thin silicon solar cells with thicknesses of 130 μm or less to which the application of a contact printing method including the screen printing is difficult. Therefore, according to the present invention, the process for manufacturing electrodes of thin silicon solar cells may be simplified.

DETAILED DESCRIPTION

The present invention will be described in detail hereinafter.

According to an embodiment of the invention, it may provide a liquid additive for etching silicon or silicic compound comprising: at least one of a first component selected from the group consisting of metal nitrate, metal acetate, and hydrates thereof; and an organic solvent.

According to an embodiment, it may further comprise at least one of a second component selected from the group consisting of another metal nitrate, another metal acetate, and hydrates thereof of which the metal is different from that of the first component.

The following Table 1 shows a composition of the liquid additive for etching a silicon or silicic compound of the present invention.

According to an embodiment, the silicic compound may be chosen from silicon nitride ($SiN_x$) and silicon oxide ($SiO_2$) and the liquid additive may etch silicon nitride ($SiN_x$ and $SiN_x$:H) anti-reflection layers and silicon oxide ($SiO_2$) passivation layers of a solar cell by non-contact printing.

Figure 1:
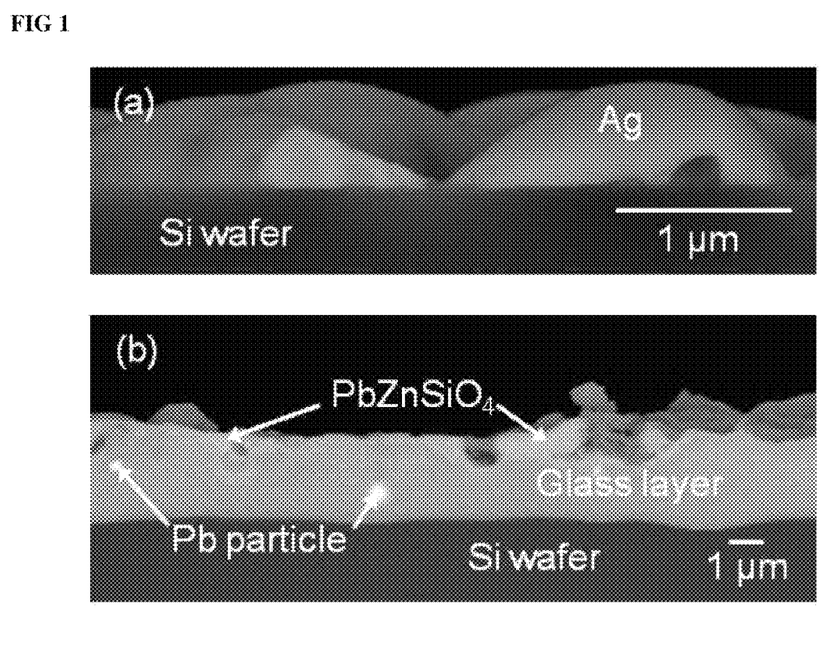
FIG. 1 illustrates scanning electron microscope (SEM) images of the cross-sections of samples processed for drying and firing after each of (a) Ag nanoparticle ink and (b) a liquid additive of the present invention is ink-jet printed on a (100) silicon wafer coated with a 80-nm-thick silicon nitride ($SiN_x$:H).

Referring to FIG. 1, etching effect of the liquid additive of the present invention to the silicon nitride layer may be noted.

FIG. 1(a) is a SEM image illustrating a silicon substrate coated with a silicon nitride layer on which a commercially available Ag nanoparticle ink (DGP-45HTG, ANP Co.) is printed and FIG. 1(b) is a SEM image illustrating a silicon substrate coated with a silicon nitride layer on which a liquid additive (Example 2) of the present invention is printed.

The silicon substrates of FIG. 1(a) and FIG. 1(b) are determined after processing the same drying and firing conditions.

As shown in FIG. 1(a) where the commercially available Ag ink is printed and fired, it is noted that the silicon nitride layer coated on the silicon substrate keeps its smoothness and is not etched.

On the other hand, it is noted that the surface of the silicon substrate, which was initially flat, is corrupted afterwards as shown in FIG. 1(b). It means that the liquid additive has etched the silicon nitride layer through the firing process.

In addition, significant amount of silicon is detected according to EDX (energy dispersive X-ray spectrometry) analysis of oxide residues present on the silicon substrate of FIG. 1(b). Even though the liquid additive of the present invention does not contain silicon at all, significant amount of silicon is detected after the liquid additive is coated and fired on the silicon substrate. That supports that the liquid additive reacts chemically with the silicon nitride or the silicon component of the silicon substrate.

As shown in FIG. 1(b), it is also verified the presence of pure lead particles and Zn-rich oxides in the oxide residue.

According to an embodiment, the first component may be chosen from the group consisting of lead nitrate, lead acetate, and hydrates thereof.

According to an embodiment, the first component may be lead nitrate.

Referring to Table 1, when the first component is not added, etching of a silicic compound does not occur. That is, the liquid additive of the present invention comprises the first component as an essential component.

According to an embodiment, the second component may be chosen from the group consisting of zinc nitrate, zinc acetate, and hydrates thereof.

According to an embodiment, the second component may be zinc nitrate hexahydrate.

The zinc compound is not an essential component.

When the liquid additive of the present invention is printed or coated on a silicon nitride or silicon oxide layer, glass phase may be formed during the firing process.

However, when the zinc compound is added along with the lead compound, it promotes the formation of glass phase in molten state during the firing process and benefits the formation of electrodes of a silicon solar cell.

Referring to Table 1, the ratio between Pb and Zn may be from 100:0 to 10:90, preferably 91:9 to 54:46.

Figure 2:
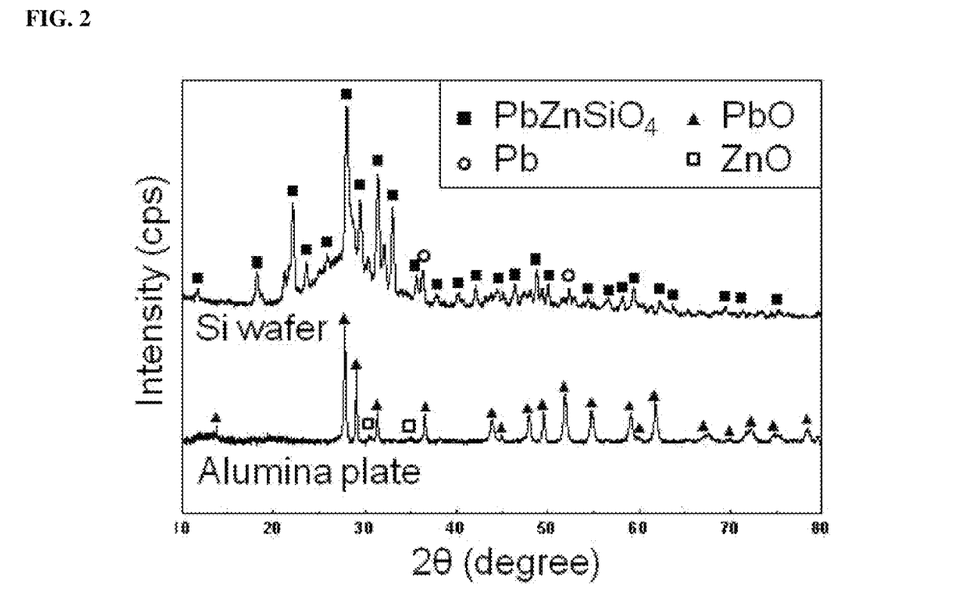
FIG. 2 illustrates X-ray diffraction (XRD) patterns obtained from the surfaces of the samples that are processed for drying and firing after a liquid additive of the present invention is ink-jet printed on each of an alumina ($Al_2O_3$) substrate and a (100) silicon wafer coated with a 80-nm-thick silicon nitride ($SiN_x$:H).

FIG. 2 illustrates X-ray diffraction (XRD) patterns of the surfaces of samples processed for drying and firing after a liquid additive of Example 2 is ink-jet printed on each of an alumina ($Al_2O_3$) substrate and a silicon substrate which is coated to a thickness of 80 nm with silicon nitride ($SiN_x$:H).

Referring to FIG. 2, when the liquid additive is fired on the alumina substrate, residues are composed of lead oxide (PbO, JCPDS 05-0570) and zinc oxide (ZnO, JCPDS 36-1451) which is resulted from the nitrate contained in the initial liquid additive. In this case, a glass phase is not formed.

However, when the liquid additive is fired on the silicon substrate coated with a silicon nitride, it is noted that residues are a mixture of glass and crystalline phases. Such result is also shown in FIG. 1(b).

Peaks of the crystalline phases represent $PbZnSiO_4$ (JCPDS 20-0607) and Pb(JCPDS 04-0686) and this is consistent with the result of FIG. 1(b). Thus, it is noted that a molten glass phase is formed after the nitrate of the liquid additive is thermally decomposed into the corresponding oxide and reacted with silicon nitride and silicon substrate during the firing process. Lead particles present in the glass may be likely generated by a redox reaction between lead oxide generated during the firing process and the silicon nitride layer or the silicon substrate.

According to an embodiment, the organic solvent may be chosen from the group consisting of alcohol, polyhydric alcohol, ether, and glycol ether.

According to an embodiment, the organic solvent may be polyhydric alcohol.

The polyhydric alcohol is an alcohol having 2 or more of hydroxyl groups (—OH) in the molecular. It is divided into secondary alcohol (glycol, $HOCH_2CH_2OH$), tertiary alcohol (glycerol, $HOCH_2CH(OH)CH_2OH$) and the like according to the number of hydroxyl group. It can be well mixed with water and form ester, ether etc., like primary alcohol. It is also widely used as a solvent.

According to an embodiment, the polyhydric alcohol may be ethylene glycol.

According to another aspect of the present invention, it provides a non-contact printing metal ink for manufacturing silicon solar cell electrodes, comprising: the liquid additive of the present invention; and a metal for forming electrodes.

The liquid additive of the present invention, after mixing with a metal ink, is printed on a silicon solar cell substrate and fired to form electrodes. The results are shown in the following Tables 2, 3, 5 and 6.

The formation of electrodes means that the silicon nitride or silicon oxide layer is etched, and the bulk Ag and the silicon substrate are electrically connected by the formation of Ag crystallites on the silicon substrate surface. Therefore, it is important for the ohmic contact formation that a metal component contained in the printable ink reacts with Si to form metal crystallites on the silicon substrate surface.

It is generally known that glass frit contained in a paste for screen printing etches a silicon nitride layer during the firing process in manufacturing electrodes of a silicon solar cell.

According to a mechanism for forming electrodes of a silicon solar cell by using the screen printing, it is known that the glass frit is an essential in the formation of Ag crystallites since it melts during the firing process and Ag ions ($Ag^+$) function as a medium to diffuse into the surface of the silicon substrate.

Figure 3:
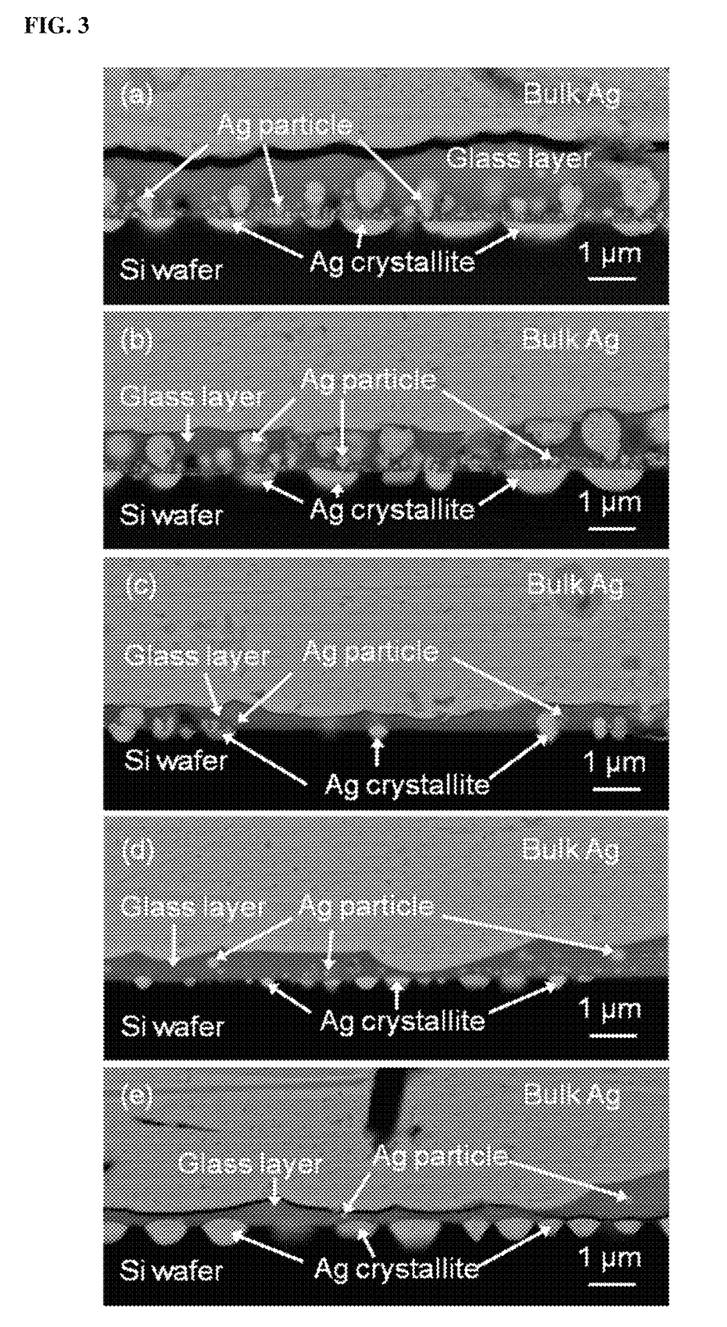
FIG. 3 illustrates scanning electron microscope (SEM) images of the cross-sections of the samples that are processed for drying and firing after each of the Ag nanoparticle inks mixed with various proportions of liquid additives of the present invention is ink-jet printed on a (100) silicon wafer coated with a 80-nm-thick silicon nitride ($SiN_x$:H).

In FIG. 3, it can be seen that a liquid additive of the present invention, which is mixed in Ag ink for a non-contact printing, performs a similar role to the glass frit included in Ag paste during the firing process.

FIG. 3 illustrates scanning electron microscope (SEM) images of samples processed for drying and firing under the condition in Example 56 of Table 6 after each of Ag nanoparticle inks manufactured according to Example 16 to Example 20 of Table 2, respectively, is printed on a n-type (100) Si wafer which is coated to a thickness of 80 nm with silicon nitride ($SiN_x$:H).

Referring to FIG. 3, the silicon nitride layer is etched (fire-through) and Ag crystallites are formed on the surface of the silicon substrate during the firing process regardless changes in mass ratio of Ag:(Pb+Zn) from 95:5 to 99:1. Here, each mass ratio of Ag:(Pb+Zn) is (a) 95:5, (b) 96:4, (c) 97:3, (d) 98:2 and (e) 99:1.

It is also noted that a glass layer in which Ag particles are dispersed is present between the silicon substrate, on which Ag crystallites are formed, and the fired bulk Ag.

According to the EDS analysis, the glass layer is composed of oxides of lead, silicon and zinc. A cross-sectional microstructure including the glass phase is similar to the cross-sectional microstructure of silicon solar cell electrodes manufactured by the screen printing of Ag paste.

According to an embodiment, the mass ratio of (Pb+Zn) of the liquid additive and the metal for forming electrodes may be in the range of 5:95 to 1:99.

Referring to FIG. 3, a thickness of the glass layer decreases as amount of the liquid additive included in Ag ink for forming silicon solar cell electrodes is reduced. It is apparent that a thickness of the glass layer present between the silicon substrate and the bulk Ag be thinner to form quality ohmic electrodes (or ohmic contact) having low contact resistance.

According to embodiment of the present invention, even though a mass ratio of Ag:(Pb+Zn) is 99:1 of which (Pb+Zn) mass is small amount based to Ag particle mass, the silicon nitride layer is etched and the Ag crystallites are formed on the silicon substrate through firing.

According to an embodiment, the metal may be silver or nickel.

According to an embodiment, a diameter of the metal may be 200 nm to 5 nm.

The present invention provides a printable metal ink, preferably non-contact ink-jet printable metal ink. When a diameter of the metal particle in the metal ink is larger than 200 nm, it is difficult to form fine wiring patterns, a nozzle can be blocked and quality of ink can be deteriorated due to poor dispersion of the metal particles. When a diameter is less than 5 nm, a nozzle can be also blocked because flowability of the metal ink becomes lower and quality of ink can be also deteriorated because surface characteristics of the metal particles are changed.

According to an embodiment, the metal may be a metal compound dissolved in a solvent.

According to an embodiment, the metal compound may be silver nitrate or nickel nitrate.

The metal compound of the present invention may be well dissolved in an organic solvent since a liquid additive of the present invention is suitable for the non-contact printing. The nickel nitrate is well dissolved in an organic solvent and usable for forming electrodes of a solar cell. The nickel nitrate is usually present in the hydrated salt so that it includes the chemical compound $Ni(NO_3)_2$ or any hydrate thereof.

According to another aspect of the present invention, it provides a method for manufacturing silicon solar cell electrodes comprising; preparing the liquid additive described above; manufacturing a metal ink by mixing the liquid additive with a metal; printing the metal ink on the silicic compound layer of the front or back side of a solar cell by a non-contact printing method; and firing the metal ink at 700° C. to 850° C., more preferably 700° C. to 835° C.

According to an embodiment, the method may further comprise drying the printed metal ink at 120° C. to 350° C.

It is known that the thermal decomposition temperatures of lead nitrate, lead acetate and zinc nitrate hexahydrate dissolved in the liquid additive of the present invention is 455° C., 180° C. and 145° C., respectively. As for the firing conditions shown in Table 6, it is expected that the lead nitrate thermally decomposes to PbO, $NO_x$ and $O_2$ and the decomposed PbO further reacts with silicon nitride and silicon to form molten $PbO$—$SiO_2$ glass layer during the firing process. Such facts are found in cross-section SEM images of FIG. 1(b) and FIG. 3.

The eutectic temperature of the binary $PbO$—$SiO_2$ system is about 700° C. and that of the binary Ag—Si system is 835° C. When the liquid additive of the present invention is used, the silicon nitride layer may be etched at a temperature between 700° C. and 800° C. which is lower than the eutectic temperature of the Ag—Si system and ohmic contacts may be formed between the silicon substrate and the bulk Ag.

Therefore, use of the liquid additive of the present invention may allow manufacturing electrodes of a thin silicon solar cell, which can be difficult to apply a contact printing, by a single-step non-contact printing and firing process.

According to an embodiment, the silicic compound may be chosen from the group consisting of silicon nitride ($SiN_x$) and silicon oxide ($SiO_2$).

According to an embodiment, the method may further comprise increasing the aspect ratio of the manufactured electrode lines of silicon solar cells by plating metals.

According to an embodiment, the plating may be light-induced plating.

The aspect ratio may be increased by 10 times to 40 times through the plating process. That is, when the metal ink is printed by the non-contact printing and fired, bulk Ag having a thickness of 1 μm to 2 μm can be formed and then the thickness thereof can be increased to 40 μm through the plating process.

Hereinafter, although more detailed descriptions will be given by Examples, those are only for explanation and there is no intention to limit the invention.

EXAMPLE

Manufacturing a Liquid Additive for Etching a Silicic Compound

Various liquid additives for etching a silicic compound were manufactured by mixing a first component and a second component in various ratios as shown in Table 1 and then dissolving the mixture in an organic solvent at room temperature.

When ethylene glycol was used as an organic solvent, lead nitrate ($Pb(NO_3)_2$) or lead acetate ($Pb(C_2H_3O_2)_4$) of the first component and zinc nitrate hexahydrate ($Zn(NO_3)_2 6H_2O$) of the second component were dissolved easily at room temperature. When triethylene glycol monoethyl ether (TGME) was used as an organic solvent, lead nitrate ($Pb(NO_3)_2$) of the first component and zinc nitrate hexahydrate ($Zn(NO_3)_2 6H_2O$) of the second component were dissolved easily at room temperature. As shown in Table 1, a ratio of the lead compound of the first component and the zinc compound of the second component dissolved in 2 ml of the organic solvent was controlled based on a mass ratio of lead (Pb) in the first component and zinc (Zn) in the second component to be from 100:0 to 0:100. Amount of each component is represented in Table 1.

TABLE 1

| Example | Pb:Zn (mass ratio) | the first component (g) | | the second component (g) | | organic solvent (ml) | | Etching of a silicon nitride and silicon oxide |
|---|---|---|---|---|---|---|---|---|
| 1 | 100:0 | lead nitrate | 0.15 | zinc nitrate hexahydrate | 0 | ethylene glycol | 2 | o |
| 2 | 91:9 | | 0.14 | | 0.04 | | | o |
| 3 | 73:27 | | 0.11 | | 0.11 | | | o |
| 4 | 54:46 | | 0.07 | | 0.19 | | | o |
| 5 | 33:67 | | 0.04 | | 0.27 | | | o |
| 6 | 11:89 | | 0.02 | | 0.34 | | | o |
| 7 | 0:100 | | 0 | | 0.38 | | | x |
| 8 | 91:9 | lead acetate | 0.19 | zinc nitrate hexahydrate | 0.04 | ethylene glycol | 2 | o |
| 9 | 100:0 | lead nitrate | 0.15 | zinc nitrate hexahydrate | 0 | triethylene glycol monoethyl ether (TGME) | 2 | o |
| 10 | 91:9 | | 0.14 | | 0.038 | | | o |
| 11 | 73:27 | | 0.11 | | 0.11 | | | o |
| 12 | 54:46 | | 0.07 | | 0.19 | | | o |
| 13 | 33:67 | | 0.05 | | 0.27 | | | o |
| 14 | 11:89 | | 0.02 | | 0.34 | | | o |
| 15 | 0:100 | | 0 | | 0.38 | | | x |

Each of various liquid additives manufactured in Examples of Table 1 was ink-jet printed on a single crystalline silicon substrate which was coated to a thickness of about 80 nm with silicon nitride ($SiN_x$:H) or silicon oxide ($SiO_2$), dried in an oven at 150° C. for 5 min under air ambient, fired at a peak temperature of 800° C. for 1 min using RTA (rapid thermal annealing) furnace and then cooled. The cooled samples were polished and determined if the silicic compound layer was etched or not through the SEM analysis.

As shown in Table 1, it is noted that the silicon nitride layer or silicon oxide layer coated on the silicon substrate was not etched when the liquid additive did not contain a lead compound. It means that the liquid additive should include the lead compound to etch the silicic compound layer at a temperature of 800° C. or less.

It is not necessary to include a zinc compound in the liquid additive. However, it is preferable that the liquid additive contain the zinc compound to be a mass ratio of Pb:Zn, 91:9 to 54:46 since it promotes the formation of the molten glass layer and thus further benefits the formation of electrodes of a silicon solar cell.

Manufacturing a Non-Contact Printable Ag Ink for the Formation of Silicon Solar Cell Electrodes Each of various liquid additives manufactured in Example 1 to Example 15 of Table 1 was mixed with commercially available Ag nanoparticle ink (DGP-45HTG, ANP CO.) at room temperature to manufacture Ag nanoparticle ink for non-contact printing for forming electrodes of a silicon solar cell as in Table 2 and Table 3. The commercially available Ag nanoparticle ink was an ink where Ag nanoparticles having an average diameter of 40 nm were dispersed in TGME solvent and Ag content was 32.21 wt. %.

The liquid additive of Example 2 in Table 1 was mixed variously with the commercially available Ag nanoparticle ink to be a mass ratio between (Pb+Zn) and Ag nanoparticles of 5:95 to 1:99.

Then, the mixture was fired and determined if an electrode was formed or not. The results are summarized in Table 2.

TABLE 2

| Example | Ag:(Pb + Zn) (mass ratio) | Ag nanoparticle ink (ml) | liquid additive (ml) | | Formation of electrode |
|---|---|---|---|---|---|
| 16 | 99:1 | 0.5 | Example 2 | 0.05 | o |
| 17 | 98:2 | 0.5 | Example 2 | 0.10 | o |
| 18 | 97:3 | 0.5 | Example 2 | 0.15 | o |
| 19 | 96:4 | 0.5 | Example 2 | 0.20 | o |
| 20 | 95:5 | 0.5 | Example 2 | 0.25 | o |

Each of liquid additives of Example 1 and Examples 3 to 15 of Table 1 was mixed with commercially available Ag nanoparticle ink at room temperature to keep Ag:(Pb+Zn) mass ratio to be 95:5 to 96:4 during the firing process. Then, the mixture was fired and determined if an electrode was formed or not. The results are summarized in Table 3.

TABLE 3

| Example | Ag:(Pb + Zn) (mass ratio) | Ag nanoparticle ink (ml) | liquid additive (ml) | | Formation of electrode |
|---|---|---|---|---|---|
| 21 | 95:5 | 0.5 | Example 1 | 0.25 | o |
| 22 | 96:4 | 0.5 | Example 3 | 0.25 | o |
| 23 | 96:4 | 0.5 | Example 4 | 0.25 | o |
| 24 | 96:4 | 0.5 | Example 5 | 0.25 | o |
| 25 | 96:4 | 0.5 | Example 6 | 0.25 | o |
| 26 | 96:4 | 0.5 | Example 7 | 0.25 | x |
| 27 | 95:5 | 0.5 | Example 8 | 0.25 | o |
| 28 | 95:5 | 0.5 | Example 9 | 0.25 | o |
| 29 | 95:5 | 0.5 | Example 10 | 0.25 | o |
| 30 | 95:5 | 0.5 | Example 11 | 0.25 | o |
| 31 | 96:4 | 0.5 | Example 12 | 0.25 | o |
| 32 | 96:4 | 0.5 | Example 13 | 0.25 | o |
| 33 | 96:4 | 0.5 | Example 14 | 0.25 | o |
| 34 | 96:4 | 0.5 | Example 15 | 0.25 | x |

As shown in Tables 2 and 3, it was noted that the electrode was formed for all Examples, except Example 26 and Example 34 in which the liquid additive did not includes lead nitrate.

It was also noted that the Ag nanoparticle ink including the liquid additive of the present invention for forming silicon solar cell electrodes had excellent stability since there was no decomposition, separation or precipitation of components during it was stored at room temperature.

In addition, Ag compound ink for forming silicon solar cell electrodes, instead of Ag nanoparticle ink, was manufactured by mixing a liquid additive with Ag compound ink.

The Ag compound ink was manufactured by dissolving Ag compound which is composed of Ag-organic compound or Ag-inorganic compound in an organic solvent, and it is liquid. When Ag-organic compound among Ag compound inks is dissolved in an organic solvent, a liquid Ag ink is called as Ag MOD ink.

Examples of the Ag compound used in Ag compound inks may include silver hexafluoroacetylacetonate 1,5-cyclooctadiene ($C_{13}H_{12}AgF_6O_2$), silver neodecanoate ($C_{10}H_{19}AgO_2$), silver nitrate ($AgNO_3$) and silver chloride (AgCl), etc.

Since Ag compound ink is in a liquid form, it is printable by non-contact printing such as ink-jet printing and the Ag compound can be thermally decomposed to leave Ag to form electrodes during the drying and firing process.

Only when the Ag compound ink mixed with a liquid additive of the present invention and the mixture is used for manufacturing a silicon solar cell, the silicon nitride layer or silicon oxide layer is etched and electrodes are formed.

Various Ag compound inks for forming silicon solar cell electrodes were manufactured by dissolving silver nitrate ($AgNO_3$) in ethylene glycol at room temperature as shown in Table 4 and then mixing the mixture with each of liquid additives of Example 1 to Example 15 of Table 1 at room temperature.

The manufactured Ag compound ink was printed on a silicon substrate coated with silicon nitride and fired by employing the same process described above. It was then determined if electrodes were formed or not. The results are summarized in Table 5.

TABLE 4

| Example | Ag compound | (g) | organic solvent | (ml) |
|---|---|---|---|---|
| 35 | $AgNO_3$ | 0.39 | ethylene glycol | 1 |

TABLE 5

| Example | Ag:(Pb + Zn) (mass ratio) | Ag compound ink (ml) | | liquid additive (ml) | | Formation of electrode |
|---|---|---|---|---|---|---|
| 36 | 95:5 | Example 35 | 1 | Example 1 | 0.25 | ○ |
| 37 | 95:5 | Example 35 | 1 | Example 3 | 0.25 | ○ |
| 38 | 96:4 | Example 35 | 1 | Example 4 | 0.25 | ○ |
| 39 | 96:4 | Example 35 | 1 | Example 5 | 0.25 | ○ |
| 40 | 96:4 | Example 35 | 1 | Example 6 | 0.25 | ○ |
| 41 | 96:4 | Example 35 | 1 | Example 7 | 0.25 | x |
| 42 | 95:5 | Example 35 | 1 | Example 8 | 0.25 | ○ |
| 43 | 95:5 | Example 35 | 1 | Example 9 | 0.25 | ○ |
| 44 | 95:5 | Example 35 | 1 | Example 10 | 0.25 | ○ |
| 45 | 95:5 | Example 35 | 1 | Example 11 | 0.25 | ○ |
| 46 | 96:4 | Example 35 | 1 | Example 12 | 0.25 | ○ |
| 47 | 96:4 | Example 35 | 1 | Example 13 | 0.25 | ○ |
| 48 | 96:4 | Example 35 | 1 | Example 14 | 0.25 | ○ |
| 49 | 96:4 | Example 35 | 1 | Example 15 | 0.25 | x |

As shown in Table 5, it was noted that the electrode was formed for all Examples, except Example 41 and Example 49 in which the liquid additive did not include lead nitrate.

Manufacturing Silicon Solar Cell Electrodes Under Various Firing Conditions

Each of Ag nanoparticle inks and Ag compound inks for forming silicon solar cell electrodes manufactured according to Examples in Tables 2, 3 and 5 was ink-jet printed on a n-type (100) Si wafer which was coated to a thickness of 80 nm with silicon nitride ($SiN_x$:H). The printer used for the ink-jet printing was a self-made electro-hydrodynamic printer and the printed line width was about 1 mm.

The ink-jet printed samples were dried under air ambient in an oven (VO-10X, JEIO Tech) at 150° C. for 5 min and fired in a RTA furnace (Korea Vacuum Tech LTD.) at a peak temperature of 650° C. to 800° C. for 1 sec to 60 sec after heating in a rate of 30° C./sec and then cooled. The firing conditions are summarized in Table 6.

TABLE 6

| Example | peak temperature (° C.) | peak temperature remaining time (sec) | firing condition | Formation of electrode |
|---|---|---|---|---|
| 50 | 650 | 1 | air | x |
| 51 | 700 | 1 | air | ○ |
| 52 | 750 | 1 | air | ○ |
| 53 | 800 | 1 | air | ○ |
| 54 | 800 | 10 | air | ○ |
| 55 | 800 | 30 | air | ○ |
| 56 | 800 | 60 | air | ○ |

Samples processed for the firing were mounted with epoxy resin and mirror-polished to reveal the cross-sectional microstructure. The microstructure of the reacted region was observed using SEM at back-scattered electron image (BEI) mode and the composition was analyzed using energy dispersive X-ray spectrometry (EDS).

FIG. 3 illustrates scanning electron microscope (SEM) images of the cross-sections of samples processed for drying and firing under the condition in Example 56 of Table 6 after each of Ag nanoparticle inks for forming silicon solar cell electrodes, manufactured according to Examples 16 to 20 of Table 2, was printed on a n-type (100) Si wafer which was coated to a thickness of 80 nm with silicon nitride ($SiN_x$:H).

Referring to FIG. 3, the silicon nitride layer was etched and Ag crystallites were formed on the surface of the silicon substrate during the firing process regardless of the changes in mass ratio of Ag:(Pb+Zn) from 95:5 to 99:1. The mass ratios of Ag to (Pb+Zn) were (a) 95:5, (b) 96:4, (c) 97:3, (d) 98:2 and (e) 99:1 in FIG. 3.

It was also noted that a glass layer where Ag particles were dispersed was present between the silicon substrate, on which Ag crystallites were formed, and the sintered bulk Ag.

According to the EDS analysis, it was noted that the glass layer was composed of oxides of lead, silicon and zinc. A cross-sectional microstructure thereof was similar to the cross-sectional microstructure of silicon solar cell electrodes manufactured by the screen printing of Ag paste.

It was also noted that when Ag inks for forming silicon solar cell electrodes manufactured by Examples in Table 3 and Table 5, except Example 26, Example 34, Example 41, and Example 49, were printed on the silicon nitride-coated silicon substrate, dried and fired under various conditions including firing at a peak temperature of 700° C. or higher in Examples 51 to 56, their microstructures were similar to those in FIG. 3.

It is understood that when the liquid additive of the present invention and an Ag ink for forming silicon solar cell electrodes comprising the same are used, molten glass layer is very well formed during the firing process.

Accordingly, there is provided a liquid additive suitable for the non-contact printing and able to etch silicon nitrides and silicon oxides. Such liquid additive forms a glass layer during the firing process and functions as a medium to form metal crystallites and as a physical supporter by increasing adhesion between the silicon substrate and the bulk metal after firing. When such liquid additive of the present invention is used, it allows precipitating metal particles which are finely dispersed within the thin glass layer formed between the bulk metal and the emitter silicon. In addition, when such liquid additive of the present invention is used, it allows a one-step process of etching at a temperature lower than the eutectic temperature of a metal-silicon binary alloy and forming silicon solar cell electrodes.

While it has been described with reference to particular embodiments, it is to be appreciated that various changes and modifications may be made by those skilled in the art without departing from the spirit and scope of the embodiment herein, as defined by the appended claims and their equivalents.

What is claimed is:

1. A liquid additive for a non-contact printing metal ink for manufacturing fire-through metal contacts for crystalline silicon solar cell electrodes comprising:
    a first component selected from a lead nitrate and hydrates thereof;
    a second component selected from a metal nitrate and hydrates thereof; and
    an organic solvent;
        wherein the organic solvent is at least one selected from the group consisting of polyhydric alcohol, ether, and glycol ether.

2. The liquid additive of claim 1, wherein the second component is at least one of a zinc nitrate and hydrates thereof.

3. The liquid additive of claim 1, wherein the second component is zinc nitrate hexahydrate.

4. The liquid additive of claim 1, wherein the polyhydric alcohol is ethylene glycol.

5. A non-contact printing metal ink for manufacturing silicon solar cell electrode, the metal ink comprising:
    the liquid additive according to any one of claim 1, 2, 3, or 4; and
    a metal for forming electrodes.

6. The metal ink of claim 5, wherein a mass ratio between (Pb+Zn) of the liquid additive and the metal for forming electrodes is in the range of 5:95 to 1:99.

7. The metal ink of claim 5, wherein the metal is silver or nickel.

8. The metal ink of claim 5, wherein the metal is metal particles having 200 nm to 5 nm of diameter.

9. The metal ink of claim 5, wherein the metal is a metal compound dissolved in a solvent.

10. The metal ink of claim 9, wherein the metal compound is silver nitrate or nickel nitrate.

11. A method for manufacturing silicon solar cell electrodes comprising;
    preparing the liquid additive according to any one of claim 1, 2, 3 or 4;
    manufacturing a metal ink by mixing the liquid additive with a metal;
    printing the metal ink on a silicic compound layer of the front or back side of a solar cell by a non-contact printing method; and
    firing the metal ink at 700° C. to 850° C.

12. The method of claim 11, further comprising drying process of the printed metal ink at 120° C. to 350° C.

13. The method of claim 11, wherein the silicic compound is at least one selected from the group consisting of silicon nitride ($SiN_x$) and silicon oxide ($SiO_2$).

14. The method of claim 11, further comprising increasing the aspect ratio of the manufactured electrode lines of silicon solar cells by plating a metal.

15. The method of claim 14, wherein the plating is light-induced plating.

* * * * *